(12) United States Patent
Jiang et al.

(10) Patent No.: US 6,787,399 B2
(45) Date of Patent: Sep. 7, 2004

(54) PLASTIC LEAD FRAMES FOR SEMICONDUCTOR DEVICES, PACKAGES INCLUDING SAME, AND METHODS OF FABRICATION

(75) Inventors: Tongbi Jiang, Boise, ID (US); Jerrold L. King, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/371,301

(22) Filed: Feb. 21, 2003

(65) Prior Publication Data

US 2003/0153131 A1 Aug. 14, 2003

Related U.S. Application Data

(63) Continuation of application No. 09/921,535, filed on Aug. 3, 2001, now Pat. No. 6,544,820, which is a continuation of application No. 09/639,359, filed on Aug. 14, 2000, now Pat. No. 6,294,410, which is a continuation of application No. 09/195,765, filed on Nov. 18, 1998, now Pat. No. 6,124,151, which is a continuation of application No. 08/878,935, filed on Jun. 19, 1997, now Pat. No. 5,879,965.

(51) Int. Cl.⁷ .................... H01L 21/44; H01L 21/48; H01L 21/50
(52) U.S. Cl. .................... 438/125; 438/123
(58) Field of Search .................... 438/125, 111, 438/112, 123

(56) References Cited

U.S. PATENT DOCUMENTS

| | | |
|---|---|---|
| 3,440,027 A | 4/1969 | Hugle |
| 3,868,765 A | 3/1975 | Hartleroad et al. |
| 4,079,511 A | 3/1978 | Grabbe |
| 4,089,733 A | 5/1978 | Zimmerman |
| 4,234,666 A | 11/1980 | Gursky |
| 4,281,556 A | 8/1981 | Weishew |
| 4,677,526 A | 6/1987 | Muehling |
| 4,906,802 A | 3/1990 | Castleman |
| 5,231,756 A | 8/1993 | Tokita et al. |
| 5,244,839 A | 9/1993 | Baker et al. |
| 5,341,027 A | 8/1994 | Park et al. |
| 5,446,570 A | 8/1995 | Kaneko et al. |
| 5,473,187 A | 12/1995 | Baker et al. |
| 5,569,614 A | 10/1996 | Kataoka et al. |
| 5,600,179 A | 2/1997 | Suzuki |
| 5,612,259 A | 3/1997 | Okutomo et al. |
| 5,616,953 A | 4/1997 | King et al. |
| 5,753,940 A | 5/1998 | Komoto |
| 5,770,479 A | 6/1998 | Brooks et al. |
| 5,840,214 A | 11/1998 | Kinlen |
| 5,879,965 A * | 3/1999 | Jiang et al. .................. 438/125 |
| 6,020,639 A | 2/2000 | Ulrich et al. |
| 6,091,136 A | 7/2000 | Jiang et al. |
| 6,093,958 A | 7/2000 | Inaba |
| 6,124,151 A * | 9/2000 | Jiang et al. .................. 438/125 |
| 6,245,640 B1 | 6/2001 | Claussen et al. |
| 6,294,410 B1 * | 9/2001 | Jiang et al. .................. 438/125 |
| 6,316,824 B1 | 11/2001 | Jiang et al. |
| 6,323,543 B1 | 11/2001 | Jiang et al. |
| 6,406,994 B1 | 6/2002 | Ang et al. |
| 6,544,820 B2 * | 4/2003 | Jiang et al. .................. 438/125 |

OTHER PUBLICATIONS

US 5,455,394, 10/1995, Durand et al. (withdrawn)
Rao R. Tummala et al., "Microelectronics Packaging Handbook", pps. 544–548.
Published Patent No. 2001/0054735 A1, Publication Date: Dec. 27, 2001; Name of Patentee: Nagai.
Published Patent No. 2002/0132393 A1, Publication Date: Sep. 19, 2002, Name of Patentee:Kraxenberger et al.

* cited by examiner

Primary Examiner—Kamand Cuneo
Assistant Examiner—David A. Zarneke
(74) Attorney, Agent, or Firm—TraskBritt

(57) ABSTRACT

A conductive plastic lead frame and method of manufacturing the same, suitable for use in IC packaging. In a preferred embodiment, the lead frame is constructed of a plastic or polymer based lead frame structure with an intrinsic conductive polymer coating. In a second embodiment, the lead frame is a composite plastic or polymeric material intermixed with an intrinsic conductive polymer coating.

7 Claims, 4 Drawing Sheets

PLASTIC LEAD FRAMES FOR SEMICONDUCTOR DEVICES, PACKAGES INCLUDING SAME, AND METHODS OF FABRICATION

CROSS-REFERENCE TO RELATED APPLICATIONS

This application is a divisional of application Ser. No. 09/921,535, filed Aug. 3, 2001, now U.S. Pat. No. 6,544, 820, issued Apr. 8, 2003, which is a continuation of application Ser. No. 09/639,359, filed Aug. 14, 2000, now U.S. Pat. No. 6,294,410, issued Sep. 25, 2001, which is a continuation of application Ser. No. 09/195,765, filed Nov. 18, 1998, now U.S. Pat. No. 6,124,151, issued Sep. 26, 2000, which is a continuation of application Ser. No. 08/878,935, filed Jun. 19, 1997, now U.S. Pat. No. 5,879,965, issued Mar. 9, 1999.

BACKGROUND OF THE INVENTION

1. Field of the Invention

The present invention relates to integrated circuit lead frames and methods of production thereof. In particular, this invention relates to plastic lead frames with a conductive coating or material contained therein used for packaging integrated circuits and methods of manufacturing the same.

2. State of the Art

Integrated circuit (IC) chips are enclosed in plastic packages that provide protection from hostile environments and enable electrical interconnection to printed circuit boards. During a manufacturing process, the IC chip is typically attached to a die paddle of a conventional lead frame or suspended from the lead fingers of a leads-over-chip (LOC) lead frame using an adhesive such as epoxy or double-sided tape, and subsequently encapsulated with a dense and rigid plastic by a transfer molding process. In essence, the lead frame forms the backbone of the molded plastic IC package.

Lead frames typically perform many functions such as: (1) a holding fixture that indexes with tool-transfer mechanisms as the package proceeds through various assembly operations, (2) a dam that prevents plastic from rushing out between leads during the molding operation, (3) a chip attach substrate, (4) a support matrix for the plastic, and (5) an electrical and thermal conductor from chip to board.

Traditionally, lead frames are fabricated from a strip of sheet metal by stamping or chemical milling operations. There are many different metal alloy compositions which are commercially available for producing lead frames. For example, Rao R. Tummala and Eugene J. Rymaszewski, "Microelectronics Packaging Handbook," Table 8-4, 1989, provide 16 different alloys available from 9 different manufacturers. Lead frame material selection depends on many factors such as cost, ease of fabrication, strength, thermal conductivity, and matched coefficient of thermal expansion (CTE). A close match of CTE between the silicon die and the lead frame is required to avoid chip fracture from different expansion rates.

The most widely used metal for lead frame fabrication is Alloy 42 (42% Nickel-58% Iron). Alloy 42 has a CTE near silicon and good tensile strength properties. The disadvantage of Alloy 42 is that it has low thermal conductivity. Since the lead frame is the main conduit by which heat flows from the chip to the environment and printed circuit board, this can have a profound effect on the package thermal resistance after prolonged device operation.

A layered composite strip, such as copper-clad stainless steel, was developed to emulate the mechanical properties of Alloy 42 while increasing thermal conductivity. However, copper-clad stainless steel is somewhat more expensive to manufacture than Alloy 42. When manufacturing copper-clad stainless steel lead frames, the cladding is accomplished by high-pressure rolling of copper foil onto a stainless steel strip, followed by annealing the composite to form a solid-solution weld. While copper alloys provide good thermal conductivity and have a CTE near that of low-stress molding compounds, there is a substantial CTE mismatch with respect to silicon.

While numerous alloys have been developed to solve problems with thermal conductivity, CTE mismatch, and strength, other important factors, such as ease of fabrication and cost, have not improved as readily.

Conventional methods for making lead frames for integrated circuit devices are described in U.S. Pat. No. 3,440, 027. The use of a plastic support structure in a method of forming metal lead frames is described in U.S. Pat. No. 4,089,733 (hereinafter "the '733 patent"). The plastic support structure of the '733 patent solves the problem of deformed and misaligned lead fingers resulting from stress during the bonding process by supporting the lead fingers with a plastic structure. However, the '733 patent requires a metal lead frame in addition to the plastic support structure with its attendant costs. A method of manufacturing multi-layer metal lead frames is disclosed in U.S. Pat. No. 5,231, 756 (hereinafter "the '756 patent"). The '756 patent provides an improvement in aligning power and ground planes for use in a multi-layer lead frame where such planes are necessary. However, the number of steps required to manufacture such multi-layer lead frames will not solve the problem of decreasing costs. In short, none of the related art appears to disclose methods of producing low-cost lead frames made from materials not structurally based on metal.

Since packaged ICs are produced in high volumes, a small decrease in the cost per packaged IC can result in substantial savings overall. Accordingly, there is a need in the industry for a low-cost plastic lead frame with suitable characteristics for IC packaging.

BRIEF SUMMARY OF THE INVENTION

The present invention comprises plastic lead frames coated with conductive materials or having conductive materials therein suitable for use in IC packaging and methods for fabricating the same. The invention may be used in the production of ICs.

By using plastic as the structural base for a lead frame, many costs associated with the manufacture of metal lead frames can be eliminated. For instance, plastic lead frames can be injection molded or stamped and then coated with an intrinsic conductive polymer. Furthermore, plastic is intrinsically less expensive as a bulk material than metal alloys typically used in lead frame construction.

Once the lead frame is formed, it can be used in either the conventional die attach and connect process or in a LOC process. In the conventional process, the die is adhesively attached to a die paddle using epoxy or double-sided tape, followed by wire bonding where die pads are connected to lead fingers from the lead frame. In a LOC process, the die could be attached to the lead frame fingers by double-sided adhesive tape followed by wire bonding. Alternatively, the LOC process might include direct connection between the die pads and the LOC lead frame fingers with a conductive epoxy or Z-axis conductive material using methods common in the art.

In the preferred embodiment of the invention, a plastic lead frame coated with an intrinsically conductive polymer is provided. The plastic lead frame structure can be formed by injection molding, stamping or etching from a sheet of plastic or polymer material. This plastic lead frame structure is then coated with a conductive polymer by dipping in a solution or lacquer composed of a polyaniline such as the commercially available product Ormecon™. By controlling the polyaniline coating process, precise layers with known thicknesses can be produced. The resulting low cost lead frame has a conductive layer surrounding the plastic structure. Moreover, the CTE of silicon, conductive polymer, and molding compounds is very nearly matched.

Another embodiment of the present invention is a composite plastic lead frame formed of a conventional polymer intermixed with a conductive polymer. The composite plastic lead frame structure is formed by injection molding, stamping or etching from a sheet of the composite plastic/conductive polymer material. The CTE of the lead frame is well matched to that of silicon as in the preferred embodiment; however, increased quantities of polyaniline required to provide sufficient conductivity may consequently increase cost relative to the preferred embodiment.

Additional advantages of both the above embodiments are transparency, corrosion resistance, and oxidation resistance. Polyaniline is transparent. By using transparent plastic or polymer in the lead frame structure, ultraviolet (UV), or other light source, cure of the die attach material becomes possible. This is particularly advantageous in an automated production environment. Furthermore, both of the above lead frame embodiments are nonmetallic and thus less susceptible to corrosion or oxidation.

The inventive plastic lead frames solve the problem of reducing cost while maintaining characteristics necessary for use in commercial production of IC packages. The overall cost of IC chip packaging is reduced by using plastic lead frames coated with conductive layers. Use of transparent polymers and intrinsically conductive polymers facilitates UV or other light source cure of die attach materials. Furthermore, the methods used to produce such lead frames are simple and can be easily incorporated into existing high-speed production lines for manufacturing IC chips. While the inventive plastic lead frames described herein have been illustrated with respect to conventional wire bonding and LOC interconnect technology, there is theoretically no limitation to applying the invention to conventional lead frames, emerging tape automated bonding (TAB) technology, etc. as well.

DETAILED DESCRIPTION OF THE INVENTION

An understanding of the detailed description of the invention is facilitated by reference to the drawings, FIGS. 1 through 7. Each of the four embodiments of the invention solves the problem of reducing cost of producing lead frames for IC chip packaging. Additionally, at least two of the embodiments improve the following characteristics: CTE matching of the lead frame, silicon, and adhesive, anti-corrosion, anti-oxidation, and in-line cure of the die attach adhesive.

Figure 1:
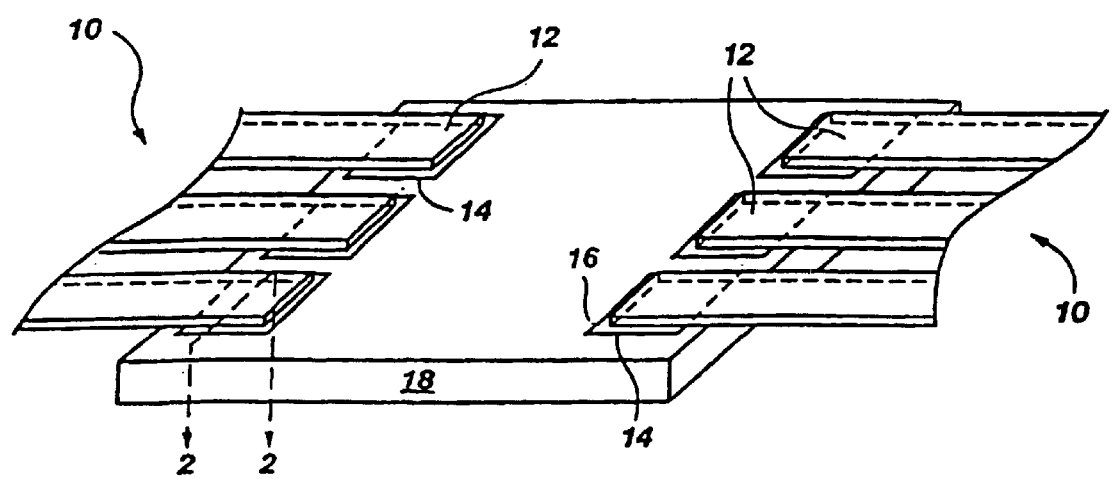
FIG. 1 is a perspective view of the inventive lead frame in a LOC configuration with direct attachment to IC die pads.

Drawing FIG. 1 shows the preferred embodiment of the inventive plastic lead frame 10 as envisioned for application in a LOC packaging configuration. The lead fingers 12 of the plastic lead frame 10 (not completely shown) are positioned over die bond pads 14. The lead fingers 12 are directly connected to the die bond pads 14 by an adhesive 16 consisting of a conductive epoxy or Z-axis conductive material. The IC chip or die 18 is suspended by the adhesive 16 connecting the lead fingers 12 of the plastic lead frame 10.

Figure 2:
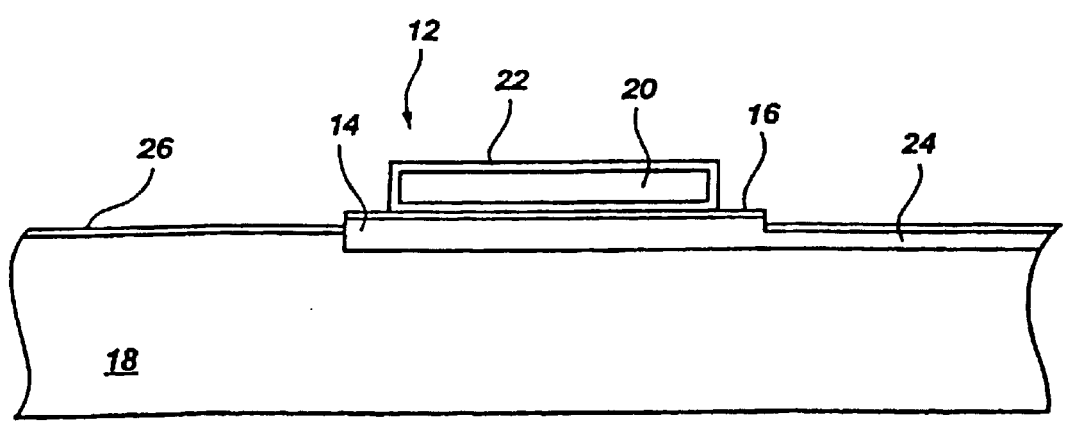
FIG. 2 is a blow-up cross-sectional view of the inventive lead frame as it would be attached to an input/output pad of an IC die in the LOC configuration.

Drawing FIG. 2 depicts an enlarged cross-sectional view of the preferred embodiment showing a lead finger 12 as attached to a die bond pad 14 on the IC die 18. The cross-section of the lead finger 12 is also shown with the inner lead frame structure 20 coated with a conductive coating 22. The conductive coating 22 could be a conductive epoxy, Z-axis conductive material, or any other suitably conductive adhesive known in the art. The die bond pad 14 is connected to a circuit trace 24 leading to components (not shown) on the IC die 18. The circuit trace 24 will typically be underneath a passivation layer of oxide 26 on the IC die 18.

Figure 3:
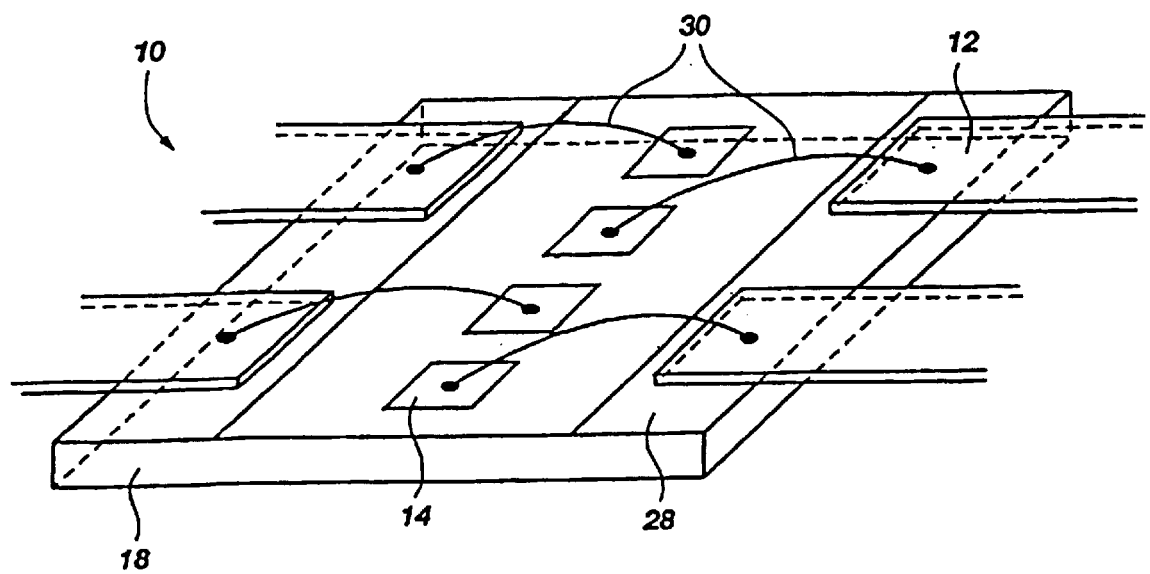
FIG. 3 is a perspective view of the inventive lead frame in a LOC configuration where the IC die is adhesively attached to the lead fingers and wire bonded to die bond pads.

Drawing FIG. 3 shows a perspective view of the preferred embodiment in a LOC configuration which utilizes conventional wire bonding. In drawing FIG. 3, lead fingers 12 of the plastic lead frame 10 (not completely shown) are located over an adhesive tape 28 which holds the IC die 18 to the plastic lead frame 10. Die bond pads 14 are connected to lead fingers 12 by means of wires 30. The wires 30 can be aluminum or gold and are attached using wire bonding machines (not shown) well established in the art.

Figure 4:
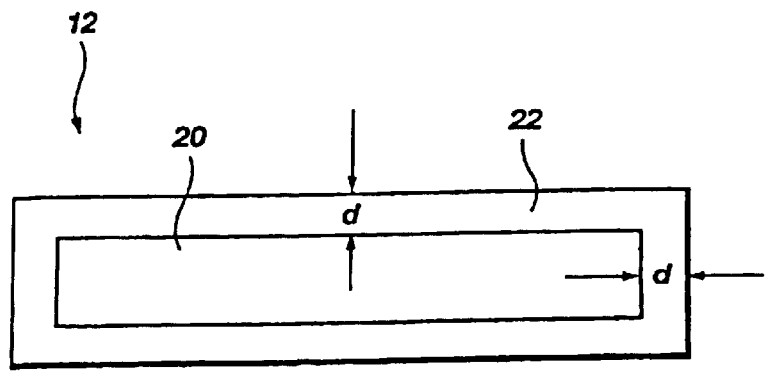
FIG. 4 is a cross-sectional view of the preferred embodiment showing the plastic frame structure with a coating of polyaniline of thickness "d"

Drawing FIG. 4 shows a magnified cross-section of a plastic lead finger 12 of the preferred embodiment of the inventive plastic lead frame 10 (not shown). The inner plastic lead frame structure 20 is made of a conventional plastic or polymer material. The surrounding conductive coating 22 is an intrinsic conductive polymer, such as polyaniline, or copper. The polyaniline layer is of thickness "d." The minimum thickness "d" necessary for suitable electrical conductivity is governed by the following equation:

$$d = 1/(\pi f \sigma \mu)^{1/2}$$

where f is the maximum frequency of the electrical device, $\mu$ is the permeability of the polyaniline layer, and $\sigma$ is the conductivity of the polyaniline layer. For example, where f is $1 \times 10^9$ Hz, $\sigma$ is $1 \times 10^5$ (Ohm·m)$^{-1}$ and $\mu$ is $1.26 \times 10^{-6}$ Henry/m, a thickness of 50 $\mu$m is needed for the polyaniline coating.

Figure 5:
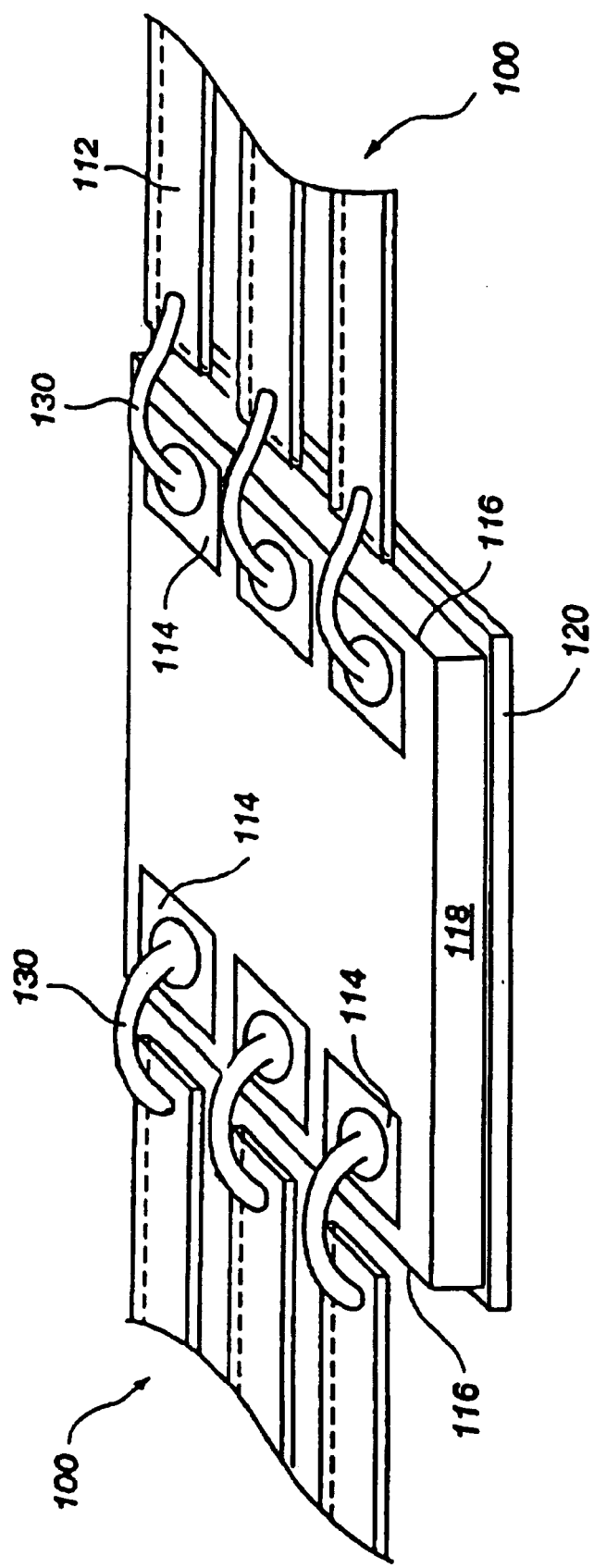
FIG. 5 is a perspective view of the inventive lead frame in a conventional lead frame configuration with wire bond attachment from IC bond pads to the lead fingers of the lead frame.

Drawing FIG. 5 shows a perspective view of the preferred embodiment in a conventional type lead frame configuration which utilizes conventional wire bonding. In drawing FIG. 5, lead fingers 112 of the plastic lead frame 100 (not completely shown) are located adjacent the sides 116 which hold the IC die 118 to the lead frame 100. Die bond pads 114 are connected to lead fingers 112 by means of wires 130. The wires 130 can be aluminum or gold and are attached using wire bonding machines (not shown) well established in the art. The IC die 118 is supported by the die paddle 120 of the lead frame 100 and is adhesively secured thereto by means of a suitable epoxy adhesive or, alternately, by means of a double-sided adhesively coated tape.

Figure 6:
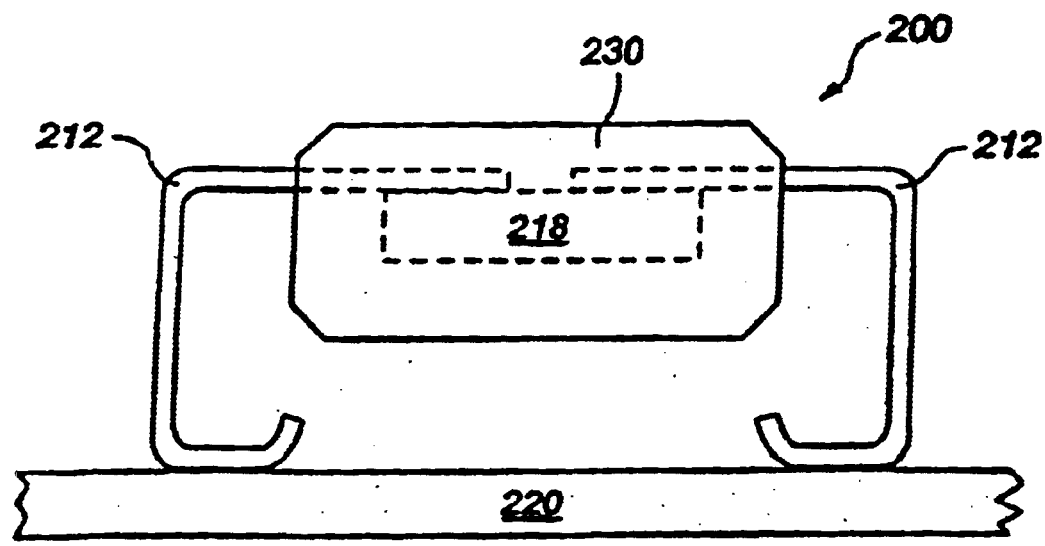
FIG. 6 is a cross-sectional view of an embodiment of the present invention of a LOC type lead frame in an encapsulated package mounted on a substrate.

Drawing FIG. 6 shows an IC die 218 encapsulated by material 230 connected to a LOC type lead frame 200 having lead fingers 212 connected to the bond pads on the active surface of the IC die 218 and connected to electrical circuits (not shown) on a substrate 220, such as a printed circuit board or the like. The lead fingers 212 may be shaped in any suitable type configuration for connection to the IC die 218 and the electrical circuits of substrate 220. The encapsulating material 230 may be of any well known suitable type and may include suitable filler material therein.

Figure 7:
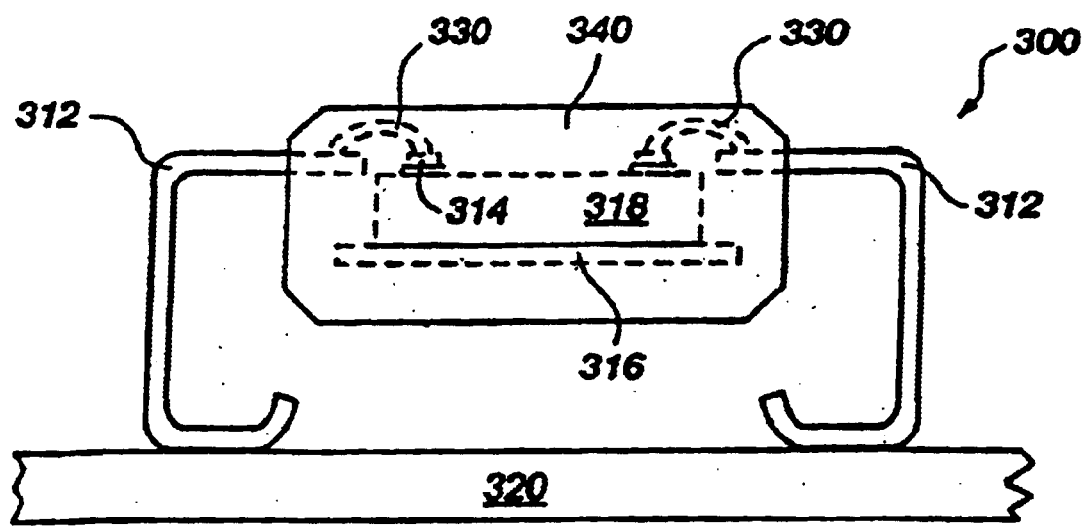
FIG. 7 is a cross-sectional view of another embodiment of the present invention of a conventional type lead frame in an encapsulated package mounted on a substrate.

Drawing FIG. 7 shows an IC die 318 encapsulated by material 340 connected to a conventional type lead frame 300 having lead fingers 312 and a die paddle 316 supporting the IC die 318. The lead fingers 312 are connected to the bond pads 314 on the active surface of the IC die 318 by wires 330 and are connected to electrical circuits (not shown) on a substrate 320. The lead fingers 312 may be shaped in any suitable type configuration for connection to the IC die 318 and the electrical circuits of substrate 320. The encapsulating material 340 may be any well known suitable type and may include suitable filler material therein.

In the preferred embodiment, plastic lead frames can be dipped in an intrinsically conductive polymer, such as polyaniline, to form a conductive layer. The polyaniline dip could be a dispersion of polyaniline in a mixture of organic solvents. The coating is finished by drying the coating with infrared heating or baking using techniques well known in the art. This dip coating process can be repeated as necessary to attain the desired thickness. Alternatively, the polyaniline can be applied in a lacquer dispersion, again using techniques well known in the art.

In a second embodiment, the polyaniline could be dispersed throughout the plastic lead frame structure using commercially available polyaniline polymer dispersions such as those offered by Zipperling Kessler & Co. The composite lead frame could be formed by injection molding or stamping a sheet of the composite polymer containing polyaniline.

In both the preferred and second embodiment, such plastic lead frames described have less CTE mismatch with respect to the silicon IC die, plastic mold compounds, and die attach materials relative to traditional metal alloys. Furthermore, conductive plastic lead frames are more flexible than metal alloy lead frames to resist bent leads. The inventive plastic lead frames can also be made transparent to enable ultraviolet radiation cure (or other light source cure) of die attach materials. This is a distinct advantage over metal alloys which are not transparent.

In a third embodiment, the plastic lead frame is formed from an injection molded or stamped plastic or polymer based sheet of material to form a lead frame structure. The plastic lead frame structure would then be coated with copper, using electroless copper plating techniques well known in the industry. Alternatively, the plastic lead frame structure could be coated with copper using chemical vapor deposition or other plating techniques known in the art. After the copper coating has been applied to the plastic lead frame, the copper may have one or more coatings or layers of coatings of other conductive metal thereon, such as a layer of nickel, palladium, silver, gold, other precious metals, etc. In this third embodiment, the resulting low-cost plastic lead frame has a conductive layer of copper with suitable electrical and thermal characteristics for IC packaging. However, the CTE mismatch between the copper plated plastic lead frame and the silicon IC die should be comparable to that associated with traditional copper-clad lead frames.

Plastic lead frames can be manufactured by injection molding, compression molding or stamping to form complex and intricate shapes. There is no particular limitation on the lead frame shape complexity other than the tools used to perform the injection molding or stamping. Furthermore, by reducing the number of steps necessary to produce the plastic lead frame, relative to a metal lead frame, a lower cost can be achieved.

Although the present invention has been described with reference to particular embodiments, the invention is not limited to these described embodiments. Rather, the invention is limited only by the appended claims, which include within their scope all equivalent devices or methods which operate according to the principles of the invention as described.

What is claimed is:

1. A manufacturing method for forming a plastic lead frame structure for use with at least one semiconductor device comprising:

providing a source of material for one of an injection molding thereof in an injection molding process, a stamping thereof in a stamping process, and an etching thereof in an etching process;

forming a plastic lead frame structure from the material; and coating the plastic lead frame structure with a conductive material.

2. The manufacturing method of claim 1, further comprising:

providing a sheet of polymeric material from the source of material; and forming the plastic lead frame structure by one of stamping the plastic lead frame structure and etching the plastic lead frame structure.

3. The manufacturing method of claim 1, wherein forming the plastic lead frame structure comprises forming the plastic lead frame structure by injection molding one of plastic material and polymer material.

4. The manufacturing method of claim 1, wherein forming the plastic lead frame structure comprises compression molding one of plastic material and polymer material.

5. The manufacturing method of claim 1, wherein coating comprises dipping the plastic lead frame structure into a solvent dispersion.

6. The manufacturing method of claim 5, wherein the solvent dispersion further comprises an intrinsic conductive polymer material.

7. The manufacturing method of claim 6, wherein the intrinsic conductive polymer material comprises a polyaniline material.

* * * * *

UNITED STATES PATENT AND TRADEMARK OFFICE
CERTIFICATE OF CORRECTION

PATENT NO. : 6,787,399 B2  Page 1 of 1
APPLICATION NO. : 10/371301
DATED : September 7, 2004
INVENTOR(S) : Tongbi Jiang and Jerrold L. King It is certified that error appears in the above-identified patent and that said Letters Patent is hereby corrected as shown below:

On the title page:
In ITEM (56) "References Cited, U.S. Patent Documents,"

$3^{rd}$ LINE, after "Baker et al." create a new line and insert
--5,297,008  3/1994  Estes--

$14^{th}$ LINE, after "Jiang et al. 438/125" create a new line and insert
--5,976,915  11/1999  Ma--

$25^{th}$ LINE, before "OTHER PUBLICATIONS," create a new section and insert:
--Foreign Patent Documents--
--JP  1-137658  5/1989 Fukuda et al.--

$34^{th}$ LINE, after the last entry under "Other Publications," insert:
--Translation of JP 1-137658, 3 pgs--

COLUMN 4, LINE 61, change "$d=1/(\pi f \sigma \mu)^{1/2}$" to
--$d = 1 / (\pi f \sigma \mu )^{1/2}$--

COLUMN 4, LINE 65, change "$(Ohm \cdot m)^{-1}$" to --$(Ohm \cdot m)^{-1}$--

Signed and Sealed this

Twelfth Day of June, 2007

JON W. DUDAS
*Director of the United States Patent and Trademark Office*